US006984988B2

(12) United States Patent
Yamamoto

(10) Patent No.: US 6,984,988 B2
(45) Date of Patent: Jan. 10, 2006

(54) GROUND-FAULT DETECTING DEVICE AND INSULATION RESISTANCE MEASURING DEVICE

(75) Inventor: Koichi Yamamoto, Susono (JP)

(73) Assignee: Yazaki Corporation, Tokyo (JP)

( * ) Notice: Subject to any disclaimer, the term of this patent is extended or adjusted under 35 U.S.C. 154(b) by 35 days.

(21) Appl. No.: 10/685,591

(22) Filed: Oct. 16, 2003

(65) Prior Publication Data
US 2004/0130326 A1 Jul. 8, 2004

(30) Foreign Application Priority Data
Oct. 16, 2002 (JP) ............................ P2002-301751

(51) Int. Cl.
G01R 31/14 (2006.01)

(52) U.S. Cl. ...................... 324/509; 324/503; 324/522

(58) Field of Classification Search ................ 324/503, 324/509, 520, 522; 702/117

See application file for complete search history.

(56) References Cited

U.S. PATENT DOCUMENTS 4,180,841 A * 12/1979 Engel ........................... 361/45
2002/0121902 A1 * 9/2002 Suzuki ......................... 324/509

FOREIGN PATENT DOCUMENTS

JP 2933490 B2 5/1999

* cited by examiner

Primary Examiner—Walter Benson
(74) Attorney, Agent, or Firm—Sughrue Mion, PLLC

(57) ABSTRACT

A ground-fault detecting device includes a power source which is electrically insulated from a vehicle body, a pulse signal generator which generates a pulse signal having a high level and a low level which appear repeatedly in a prescribed cycle, a detection resistor which is connected to the pulse signal generator and the power source, a coupling capacitor which is connected to the detecting resistor in series, an integrator which integrates a difference between a first reference voltage and a detection voltage of the pulse signal at a connecting point of the detection resistor and the coupling capacitor over an integration interval, and a ground-fault determinant which judges whether a ground fault has occurred on the basis of an output of the integrator. The integration interval is at least part of a high-level interval and a low-level interval of the pulse signal.

10 Claims, 8 Drawing Sheets

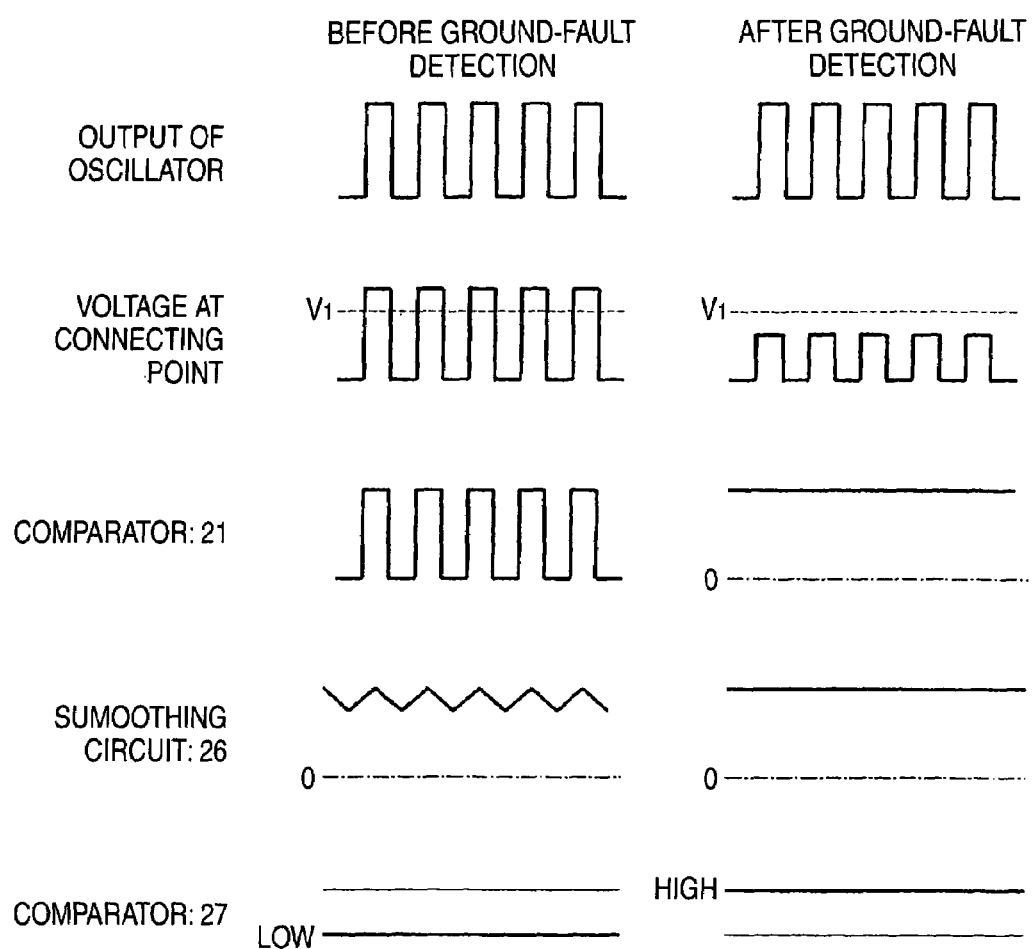

GROUND-FAULT DETECTING DEVICE AND INSULATION RESISTANCE MEASURING DEVICE

BACKGROUND OF THE INVENTION

The present invention relates to a ground-fault detecting device for detecting a ground fault in high-voltage vehicles such as EVs (electric vehicles) and HEVs (hybrid electric vehicles) and an insulation resistance measuring device for measuring an insulation resistance value at the occurrence of a ground fault.

For example, a ground-fault detecting circuit for an electric vehicle disclosed in JP-B-2933490 is known as a ground-fault detecting device of the above kind. As shown in FIGS. 7 and 8, this ground-fault detecting circuit is to detect a ground fault from batteries B to a vehicle body E in a running drive circuit system A of an electric vehicle. The running drive circuit system A includes the batteries B which are a high-voltage DC power source (e.g., 200 to 300 V), an inverter 2 as a DC-AC converter for converting, into AC voltages, a DC voltage which is supplied from the batteries B via a plus bus 4 as a DC positive-pole supply line and a minus bus 5 as a DC negative-pole supply line, and an AC motor 3 that is supplied with AC voltages from the inverter 2 via a U-phase line 6, a V-phase line 7, and a W-phase line 8 as AC supply lines. The ground-fault detecting circuit includes an oscillation circuit 10 as an AC signal output circuit and a detecting section 20 as a voltage level variation detecting circuit. A coupling capacitor 10A connects a connecting point P of the oscillation circuit 10 and the detecting section 20 and the plus bus 4 of the batteries B of the running drive circuit system A, and interrupts a DC component.

In the oscillation circuit 10, an oscillator 11 generates rectangular pulses having a constant frequency and a duty cycle of 50%. A next-stage impedance converter 12 outputs rectangular pulses having the same duty cycle as the rectangular pulses which are output from the oscillator 11. An AC output signal of the oscillation circuit 10 appears at the connecting point P via a detection resistor 13, which serves, at the occurrence of a ground fault, as part of a voltage divider that is formed by the detection resistor 13 and a ground-fault resistance 41.

The detecting section 20 is provided with a comparator 21 for comparing, with a reference voltage V1, the voltage level at the connecting point P of the detection resistor 13 and the coupling capacitor 10A where an AC output signal of the oscillation circuit 10 appears. The connecting point P is connected to the inverting input terminal of the comparator 21. A reference voltage circuit for setting the reference voltage V1 by divider resistors 22 and 23 is connected to the non-inverting input terminal of the comparator 21.

To protect the impedance converter 12 and the comparator 21 as the operational amplifier from a counter voltage or an overvoltage at the occurrence of a ground fault, protective diodes 15–18 are provided on the output side of the impedance converter 12 and the input side of the comparator 21.

With the above circuit configuration, in an ordinary state that is free of a ground fault, since there is no impedance variation at the connecting point P, rectangular pulses having a greater peak value than the present reference voltage V1 are input to the inverting input terminal of the comparator 21 and hence the comparator 21 outputs rectangular pulses having a duty cycle of 50%. Therefore, a smoothed voltage Vr that is produced by a smoothing circuit 26 consisting of a resistor 24 and a capacitor 25 is lower than a reference voltage V2. Since this smoothed voltage is input to the non-inverting input terminal of a comparator 27, the output of the comparator 27 is at a low level which indicates a normal state.

However, when a ground fault has occurred between the minus bus 5 and the vehicle body E and the ground-fault resistance 41 (see FIG. 7) has appeared, the coupling capacitor 10A is charged to the voltage of the batteries B by the route of batteries B→ coupling capacitor 10A→ detection resistor 13→ impedance converter 12→ ground line GND→ vehicle body E→ ground-fault resistance 41→ batteries B.

At the same time, since the impedance converter 12 outputs rectangular pulses as an AC output voltage, the rectangular pulses are transmitted by the route of detection resistor 13→ coupling capacitor 10A→batteries B→ ground-fault resistance 41→ vehicle body E→ impedance converter 12. Upon completion of the charging of the coupling capacitor 10A, the peak value of the rectangular pulses as the output of the impedance converter 12 decreases to an oscillation amplitude as divided by the detection resistor 13 and the ground-fault resistance 41 and is stabilized at that value.

Therefore, rectangular pulses having a smaller peak value than the reference voltage V1 are input to the inverting input terminal of the comparator 21, whereby the duty cycle of the output of the comparator 21 is changed to 100%. As a result, the smoothed voltage Vr produced by the smoothing circuit 26 consisting of the resistor 24 and the capacitor 25 becomes higher than the reference voltage V2. Since this smoothed voltage is input to the non-inverting input terminal of the comparator 27, the output of the comparator 27 becomes a high level which indicates a ground fault. As described above, when a ground fault has occurred in the batteries B, the ground fault can be detected on the basis of the output logical level of the comparator 27.

However, the related technique described in JP-B-2933490 has the following problems:

(1) The sensitivity of detection of an insulation resistance is low.

(2) The ground-fault detection accuracy is low because a ripple that appears after the smoothing is an error factor.

(3) The resistance to noise on the vehicle side is low.

(4) The accuracy lowers due to a variation in the vehicle-side capacitance.

SUMMARY OF THE INVENTION

It is therefore an object of the present invention to provide a ground-fault detecting device which increases the sensitivity and accuracy of ground-fault detection and is highly resistant to noise as well as an insulation resistance measuring device for measuring an insulation resistance value at the occurrence of a ground fault.

In order to achieve the above object, according to the present invention, there is provided a ground-fault detecting device, comprising:

a power source, electrically insulated from a vehicle body;

a pulse signal generator, generating a pulse signal having a high level and a low level which are appeared repeatedly in a prescribed cycle;

a detection resistor, connected to the pulse signal generator and the power source;

a coupling capacitor, connected to the detecting resistor in series;

an integrator, integrating a difference between a first reference voltage and a detection voltage of the pulse signal at a connecting point of the detection resistor and the coupling capacitor over an integration interval; and a ground-fault determinant, judging whether a ground fault is occurred on the basis of an output of the integrator, wherein the integration interval has at least part of a high-level interval and a low-level interval of the pulse signal.

In the above configuration, a ground-fault detecting device can be provided which increases the sensitivity of insulation resistance detection and the accuracy of ground-fault detection and is highly resistant to noise on the vehicle side.

Preferably, the integrator includes an integration circuit, integrating the difference between the detection voltage and the first reference voltage, and an integration reset signal generation circuit, generating a reset signal for rendering the integration circuit in a reset state over intervals other than the integration interval on the basis of the pulse signal supplied from the pulse signal generator.

In the above configuration, it is easy to perform the ground-fault detection by integration over a certain interval.

Preferably, the ground-fault determinant is a hysteresis comparator which compares the output of the integrator with a second reference voltage for obtaining a ground-fault detection output.

In the above configuration, a ground-fault detection output can easily be obtained on the basis of an output of the integrator obtained by integration over a certain interval.

Preferably, the ground-fault determinant is a sample-and-hold circuit which sample-and-holds the output of the integrator as an integration value for obtaining a ground-fault detection output.

In the above configuration, a ground-fault detection output can easily be obtained on the basis of an output of the integrator obtained by integration over a certain interval.

Preferably, the ground-fault detecting device further includes a compensation capacitor, having a capacitance corresponding to a vehicle-side capacitance, and provided between the vehicle body and the coupling capacitor.

In the above configuration, it is possible to reduce a ground-fault detection error due to a variation in the vehicle-side capacitance.

According to the present invention, there is also provided an insulation resistance measuring device, comprising:

a power source;

an insulation resistance, electrically insulating the power source from a vehicle body;

a pulse signal generator, generating a pulse signal having a high level and a low level which are appeared repeatedly in a prescribed cycle;

a detection resistor, connected to the pulse signal generator and the power source;

a coupling capacitor, connected to the detecting resistor in series;

an integrator, integrating a difference between a first reference voltage and a detection voltage of the pulse signal at a connecting point of the detection resistor and the coupling capacitor over an integration interval; and an A/D converter, A/D converting an output of the integrator as an integration value so as to generate a digital value corresponding to a resistance value of the insulation resistance, wherein the integration interval has at least part of a high-level interval and a low-level interval of the pulse signal.

In the above configuration, it is possible to easily obtain a digital value corresponding to the resistance value of the insulation resistor.

Preferably, the insulation resistance measuring device further includes a ground-fault determinant, judging whether a ground fault is occurred on the basis of an output of the integrator.

In the above configuration, it is possible to easily obtain a digital value corresponding to the resistance value of the insulation resistor.

BRIEF DESCRIPTION OF THE DRAWINGS

The above objects and advantages of the present invention will become more apparent by describing in detail preferred exemplary embodiments thereof with reference to the accompanying drawings, wherein:

FIG. 8 is a waveform diagram for description of operation of the ground-fault detecting circuit of FIG. 7.

DETAILED DESCRIPTION OF THE PREFERRED EMBODIMENTS

Figure 1:
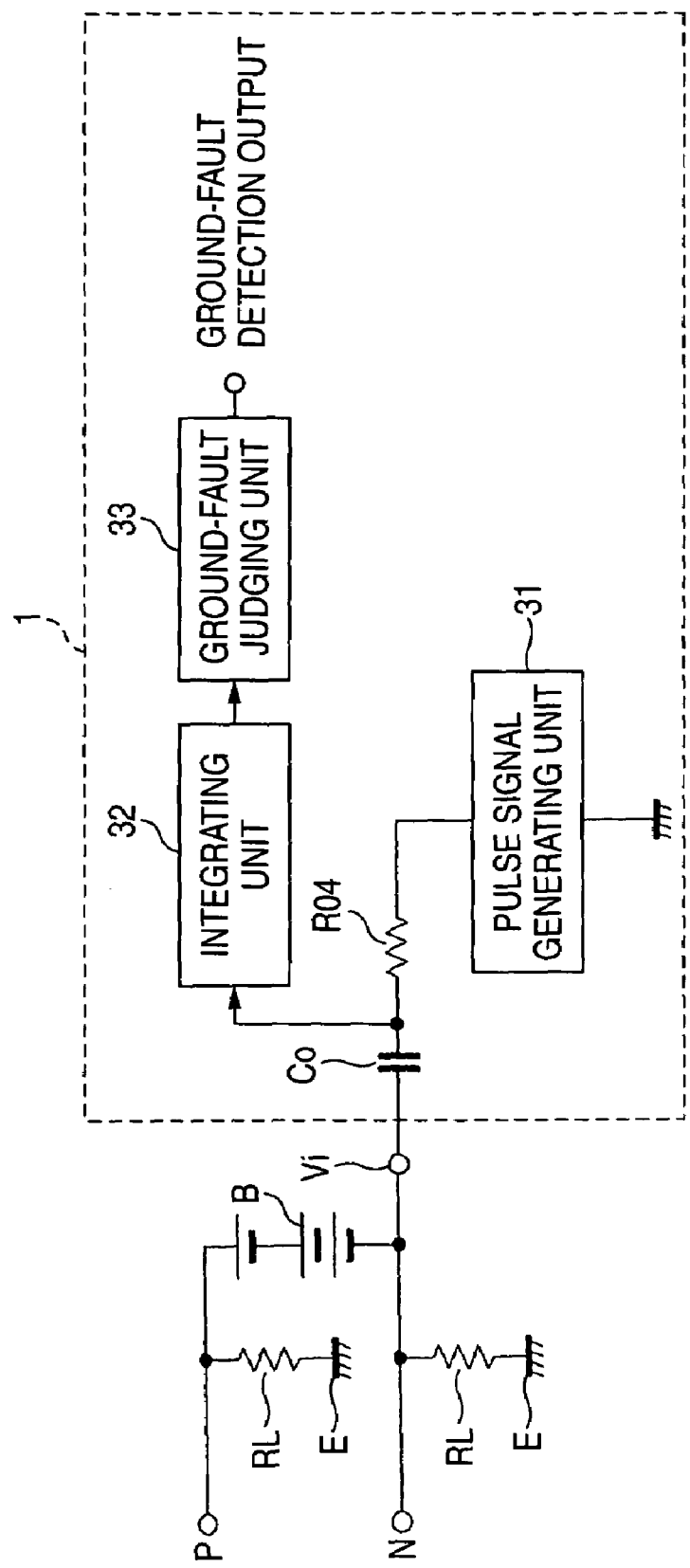
FIG. 1 is a block diagram showing a ground-fault detecting device according to a first embodiment of the present invention.

Embodiments of the present invention will be hereinafter described with reference to the drawings. FIG. 1 is a block diagram of a ground-fault detecting device according to a first embodiment of the invention. As shown in FIG. 1, the ground-fault detecting device 1 according to the invention is to detect a ground fault to a vehicle body E in a high-voltage vehicle including a DC power source system that is batteries B that are provided as a high-voltage DC power source (e.g., 200 to 300 V) for supplying a voltage to a running drive circuit system (not shown) via a plus bus P as a DC positive-pole supply line and a minus bus N as a DC negative-pole supply line and an AC circuit consisting of an inverter etc. that is connected to the DC power source system. The ground-fault detecting device includes a pulse signal generating unit 31 for producing a pulse signal in which a high level and a low level appear repeatedly in a prescribed cycle; a series connection of a detection resistor R04 and a DC-interrupting coupling capacitor Co that is provided, to apply a pulse signal generated by the pulse signal generating unit 31 to the DC power source system, between the pulse signal generating unit 31 and a vehicle-side ground-fault detection terminal Vi that is connected to the minus bus N; an integrating unit 32 for integrating, over an integration interval that is at least part of a high-level interval or a low-level interval of the pulse signal, the difference between a first reference voltage and a detection voltage Vx of the pulse signal appearing at the connecting point of the detection resistor R04 and the coupling capacitor Co; and a ground-fault judging unit 33 for obtaining a ground-fault detection output by comparing an output of the integrating unit 32 with a second reference voltage.

Figure 2:
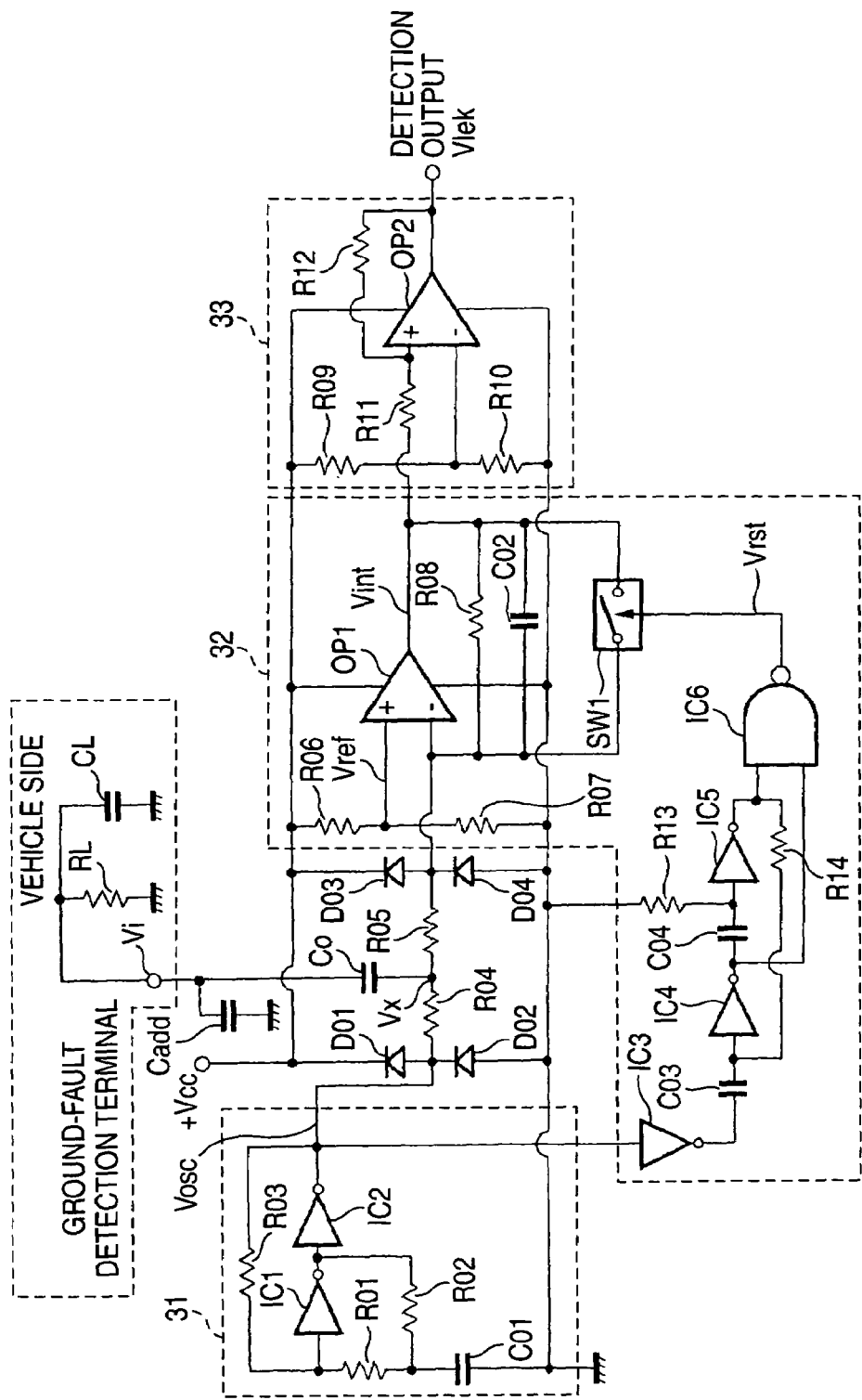
FIG. 2 is a circuit diagram showing a specific configuration of the ground-fault detecting device of FIG. 1.

FIG. 2 is a circuit diagram showing a specific configuration of the ground-fault detecting device 1 of FIG. 1. As shown in FIG. 2, the pulse signal generating unit 31 of the ground-fault detecting device 1 is a rectangular wave oscillation circuit which includes inverters IC1 and 1C2, resistors R01, R02, and R03, and a capacitor C01 and produces a rectangular pulse signal Vosc that has a constant frequency and a duty cycle of 50% and in which a high level and a low level appear repeatedly in a prescribed cycle T1. The rectangular pulse signal Vosc that is output from the rectangular wave oscillation circuit is supplied to the connecting point of the detection resistor R04 and the coupling capacitor Co and appears there as a detection voltage Vx. The detection resistor R04 serves as a part of a voltage divider that is formed by the detection resistor R04 and a vehicle-side insulation resistance RL, and divides the detection voltage Vx at the occurrence of a ground fault.

The integrating unit 32 is a resettable integration circuit which includes an integration circuit having an operational amplifier OP1, resistors R06, R07, and R08, a capacitor C02, and an analog switch SW1 and an integration reset signal generation circuit having inverters IC3, IC4, and IC5, a NAND gate IC6, resistors R13 and R14, and capacitors C03 and C04. A first reference signal Vref1 appearing at the connecting point of the resistors R06 and R07 is supplied to the non-inverting input terminal of the operational amplifier OP1 of the integration circuit. The detection voltage Vx appearing at the connecting point of the detection resistor R04 and the coupling capacitor Co is supplied to the inverting input terminal of the operational amplifier OP1 via the resistor R05. The rectangular pulse signal Vosc that is output from the rectangular wave oscillation circuit is supplied to the capacitor C03 of the integration reset signal generating circuit via the inverter IC3. A generated integration reset signal is supplied, as a control signal, to the analog switch SW1 of the integration circuit from the output terminal of the NAND gate IC6.

The ground-fault judging unit 33 is a ground-fault judgment circuit including an operational amplifier OP2 and resistors R09, R10, R11, and R12. A second reference voltage Vref2 (in this embodiment, a setting Vref2=Vref1 is made) appearing at the connecting point of the resistors R09 and R10 is supplied to the inverting input terminal of the operation amplifier OP2 of the ground-fault judgment circuit. An integration output of the integration circuit is supplied to the non-inverting input terminal of the operation amplifier OP2. The resistor R12 is provided between the non-inverting input terminal and the output terminal of the operational amplifier OP2, whereby the ground-fault judgment circuit serves as a hysteresis converter in which a transition is made from a low level to a high level when the input voltage increases past an upper limit reference voltage $V_H$ that is the second reference voltage Vref2 plus a feedback voltage that is determined by the resistors R11 and R12 and a transition is made from the high level to the low level when the input voltage decreases past a lower limit reference voltage $V_L$ that is the second reference voltage Vref2 minus the above-mentioned feedback voltage. The ground-fault judgment circuit outputs a ground-fault detection output Vlek to a detection terminal that is connected to the output terminal of the operational amplifier OP2.

Protective diodes D01, D02, D03, and D04 for protecting the output-side inverter IC2 of the pulse signal generating unit 31 and the input-side operational amplifier OP1 of the integrating unit 32 from a counter voltage or an overvoltage at the occurrence of a ground fault are connected to the output side of the pulse signal generating unit 31 and the input side of the integrating unit 32. A compensation capacitor Cadd that has a capacitance value corresponding to a vehicle-side capacitance CL that appears parallel with the insulation resistance RL and serves to reduce a ground-fault detection error due to a variation in the vehicle-side capacitance CL is provided between the vehicle body and one end of the coupling capacitor Co the other end of which is connected to the detection resistor R04. The vehicle-side capacitance CL varies when the ignition switch is turned on or off and when an AC motor is connected as a load to the AC circuit, and also varies depending on the vehicle type. Therefore, the capacitance value of the compensation capacitor Cadd is set so that the influence of such a variation in the vehicle-side capacitance becomes small.

Figure 3A:
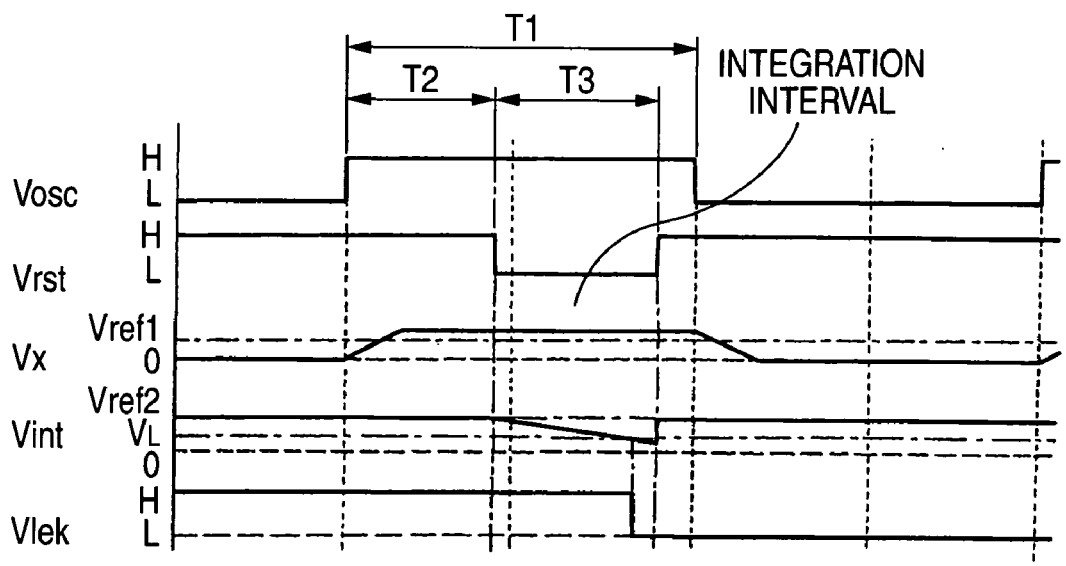
FIGS. 3A and 3B are timing charts of signals at individual points in the circuit diagram of FIG. 2 in a state that is free of a ground fault and at the occurrence of a ground fault, respectively.
Figure 3B:
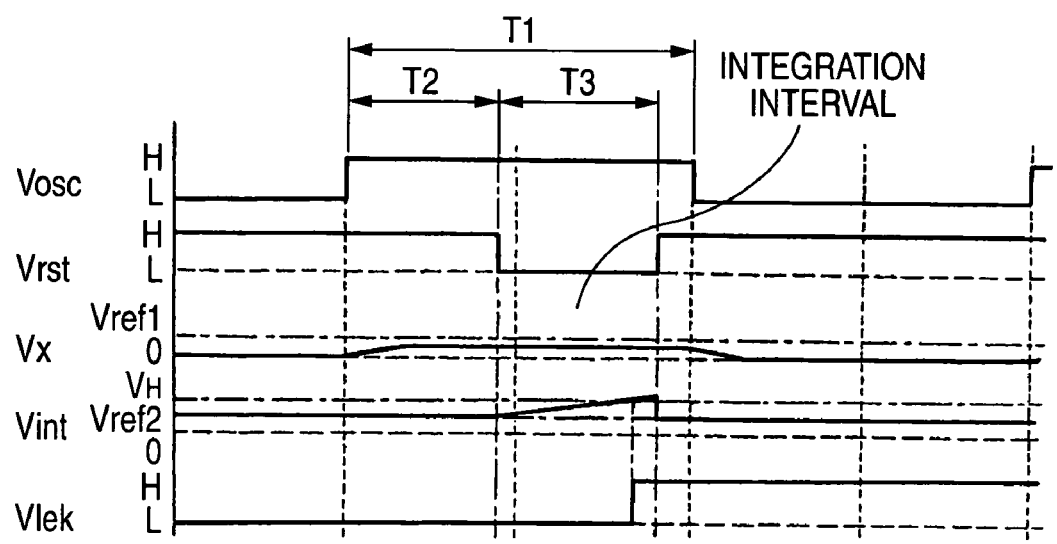

Next, the operation of the above-configured ground-fault detecting device 1 will be described with reference to a timing chart of FIG. 3 showing signals at individual points. FIGS. 3A and 3B are timing charts of signals at individual points in a state that is free of a ground fault and at the occurrence of a ground fault, respectively.

First, in an ordinary state that is free of a ground fault, the insulation resistance RL is almost infinitely large. Therefore, the rectangular pulse signal Vosc (output from the pulse signal generating unit 31) that has a constant frequency and a duty cycle of 50% and in which the high level and the low level appear repeatedly in the prescribed cycle T1 as shown in FIG. 3A is supplied to the integrating unit 32 via the detection resistor R04 and the resistor R05 as the detection voltage Vx having a waveform shown in FIG. 3A without causing a current flow between the plus bus P or the minus bus N of the batteries B and the vehicle body E via the coupling capacitor Co. The peak value of the detection voltage Vx that is supplied to the inverting input terminal of the operational amplifier OP1 of the integration circuit of the integrating unit 32 is set greater than the first reference voltage Vref1 that is supplied to the non-inverting input terminal of the operational amplifier OP1 of the integration circuit.

As seen from the waveform of FIG. 3, when the detection voltage Vx is close to a rectangular wave, the peak value of the rectangular wave is given by the following approximate Equation (1).

[Formula 1]

$$\mathrm{Vx\_pk} = \frac{R_L}{2(R_L + R04)} V_{cc} + \frac{V_{cc}}{2} \qquad (1)$$

The rectangular pulse signal which is output from the pulse signal generating unit 31 is also supplied to the capacitor C03 of the integration reset signal generating circuit via the inverter IC3. On the basis of the supplied rectangular pulse signal, the integration reset signal generation circuit generates an integration reset signal Vrst that is at a low level in an integration interval T3 that is at least part of a high-level interval T1 of the rectangular pulse signal and at a high level in the intervals other than the integration interval T3 as shown in FIG. 3A. The generated integration reset signal Vrst is supplied to the analog switch SW1 of the integration circuit as a control signal. As a result, during the intervals other than the integration interval T3, the analog switch SW1 is controlled so as to be kept on and resets the integration circuit by short-circuiting both ends of the capacitor C02. During the integration interval T3, the analog switch SW1 is controlled so as to be kept off and allows the integration circuit perform an integration operation by opening both ends of the capacitor C02.

As a result, the integration circuit supplies the ground-fault judging unit 33 with an integration output Vint having such a waveform as to be at the level Vref2 in the intervals other than the integration interval T3 and to decrease gradually from the level Vref2 through integration of the difference between the detection voltage Vx and the first reference voltage Vref1 in the integration interval T3. The integration output Vint is given by the following Equation (2).

[Formula 2]

$$V_{int} = -\frac{1}{R05 \times C02} \int_0^{T3} (V_{x\_pk} - Vref1) dt \quad (2)$$

In the hysteresis converter as the ground-fault judging unit 33, when the level of the supplied integration output has become lower than the lower limit reference voltage $V_L$, the output of the hysteresis converter makes a transition from a high level to a low level and a low-level signal representing a judgment result "no ground fault" appears at the detection terminal. Even if the next high-level section of the rectangular pulse signal is output from the pulse signal generating unit 31, a low-level signal representing a judgment result "no ground fault" continues to appear at the detection terminal because the integration output Vint is always lower than or equal to the level Vref2.

Next, if a ground fault has occurred and the insulation resistance RL has decreased, the rectangular pulse signal that is output from the pulse signal generating unit 31 also flows to the vehicle E via the coupling capacitor Co and the insulation resistance RL, whereby the detection voltage Vx is divided by the detection resistor R04 and the insulation resistance RL and its peak value becomes smaller than the first reference voltage Vref1 as shown in FIG. 3B. Such a detection voltage Vx is supplied to the integrating unit 32 via the detection resistor R04 and the resistor R05.

As a result, the integration circuit supplies the ground-fault judging unit 33 with an integration output Vint having such a waveform as to be at the level Vref2 in the intervals other than the integration interval T3 and to increase gradually from the level Vref2 through integration of the difference between the first reference voltage Vref1 and the detection voltage Vx in the integration interval T3.

In the hysteresis converter as the ground-fault judging unit 33, when the level of the supplied integration output has become higher than the upper limit reference voltage $V_H$, the output of the hysteresis converter makes a transition from the low level to the high level and a high-level signal representing a judgment result "ground fault" appears at the detection terminal. Even if the next high-level section of the rectangular pulse signal is output from the pulse signal generating unit 31, a high-level signal representing a judgment result "ground fault" continues to appear at the detection terminal because the integration output Vint is always higher than or equal to the level Vref2.

In the above-described manner, when a ground fault has occurred in the batteries B, a ground-fault detection output can be obtained at the detection terminal.

By substituting realistic values (representative values) of the respective variables such as R05=100 kΩ, C0=0.022μF, and T3=22 ms into Equation (2) which represents the integration output voltage Vint, the following Equation (3) is obtained.

[Formula 3]

$$\begin{aligned}
V_{int} &= -\frac{1}{100 \text{ K}\Omega \times 0.022 \text{ }\mu\text{F}} \int_0^{22 \text{ ms}} (V_{x\_pk} - Vref1) dt \\
&= -10(V_{x\_pk} - Vref1) \\
&= -10\left[\frac{R_L}{2(R_L + R04)} Vcc + \frac{Vcc}{2} - Vref1\right]
\end{aligned}$$

In this case, the gain of the resettable integration circuit is equal to 10. On the other hand, the related device of FIG. 7 performs a threshold judgment on the detection voltage Vx.

Therefore, in the ground-fault detecting device according to this embodiment, the sensitivity of detection of the insulation resistance RL can be made higher than in the related device. Further, the range around the threshold value for the ground-fault judgment where occurrence/non-occurrence of a ground fault is unclear can be narrowed, and hence the accuracy of ground-fault detection can be increased.

Figure 7:
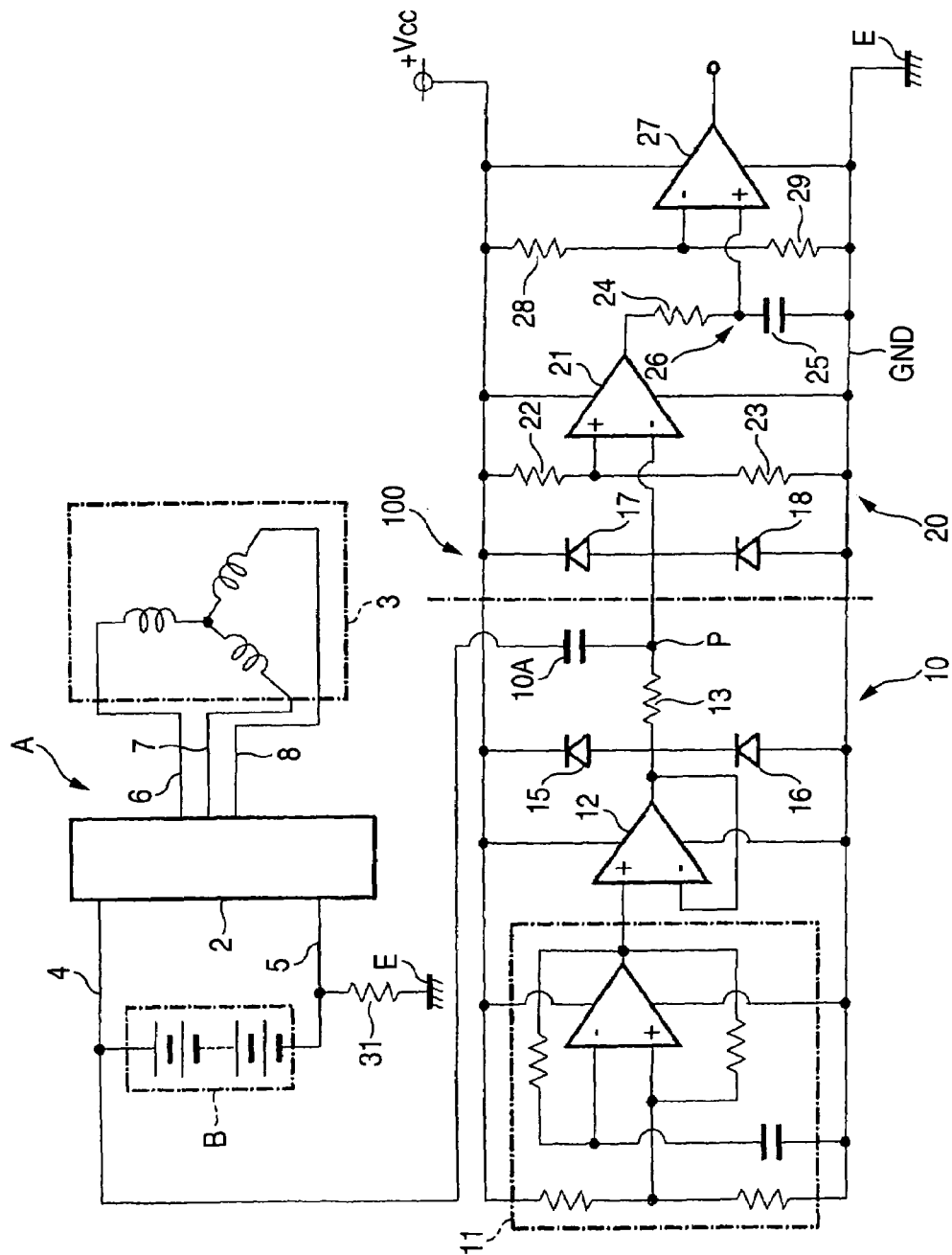
FIG. 7 is a circuit diagram of a related ground-fault detecting circuit.

The range around the threshold value for the ground-fault judgment where occurrence/non-occurrence of a ground fault is unclear is a range where occurrence/non-occurrence of a ground fault cannot be judged on the basis of the output of the ground-fault detecting device. Distortion of the rectangular wave as the voltage at the connecting point P shown in FIG. 8 (JP-B-2933490) makes the judgment of occurrence/non-occurrence of a ground fault indefinite in the vicinity of the threshold value for the ground-fault judgment. In the circuit of FIG. 7, a current flows through the insulation resistance 31 to check whether a ground fault has occurred. Therefore, the voltage across the coupling capacitor 10A varies depending on the current flowing through the coupling capacitor 10A, and the variation of the voltage across the coupling capacitor 10A causes distortion of the rectangular wave. It is difficult for a practical circuit to avoid such distortion of the rectangular wave. When the rectangular wave as the voltage at the connecting point P (patent document-1) is distorted and the peaks of the rectangular wave as the voltage at the connecting point P are inclined, the ground-fault judgment output of the comparator 27 (see FIG. 7) has two states, that is, high and low states. The range where the two states (high and low states) exist is the range where occurrence/non-occurrence of a ground fault cannot be judged on the basis of the output of the ground-fault detecting device. In contrast, in the invention, occurrence/non-occurrence of a ground fault is judged on the basis of an integration output voltage value obtained by integrating the difference between the threshold voltage Vref1 for the ground-fault judgment and the detection voltage Vx over a certain interval, as a result of which the range where the ground-fault judgment output like the output of the comparator 27 in JP-B-2933490 is indefinite is narrow. In the invention, the range around the threshold value for the ground-fault judgment where occurrence/non-occurrence of a ground fault is unclear can be made narrower than in the related device by setting the parameters of the downstream ground-fault judgment circuit properly.

Further, in the invention, since the difference between the threshold voltage Vref1 for the ground-fault judgment and the detection voltage Vx is integrated over a certain interval, noise whose period is sufficiently shorter than the integration interval and that has symmetrical positive and negative portions can be eliminated. This is because when noise having symmetrical positive and negative portions is input to an integration circuit, it is canceled out in each cycle.

Figure 4:
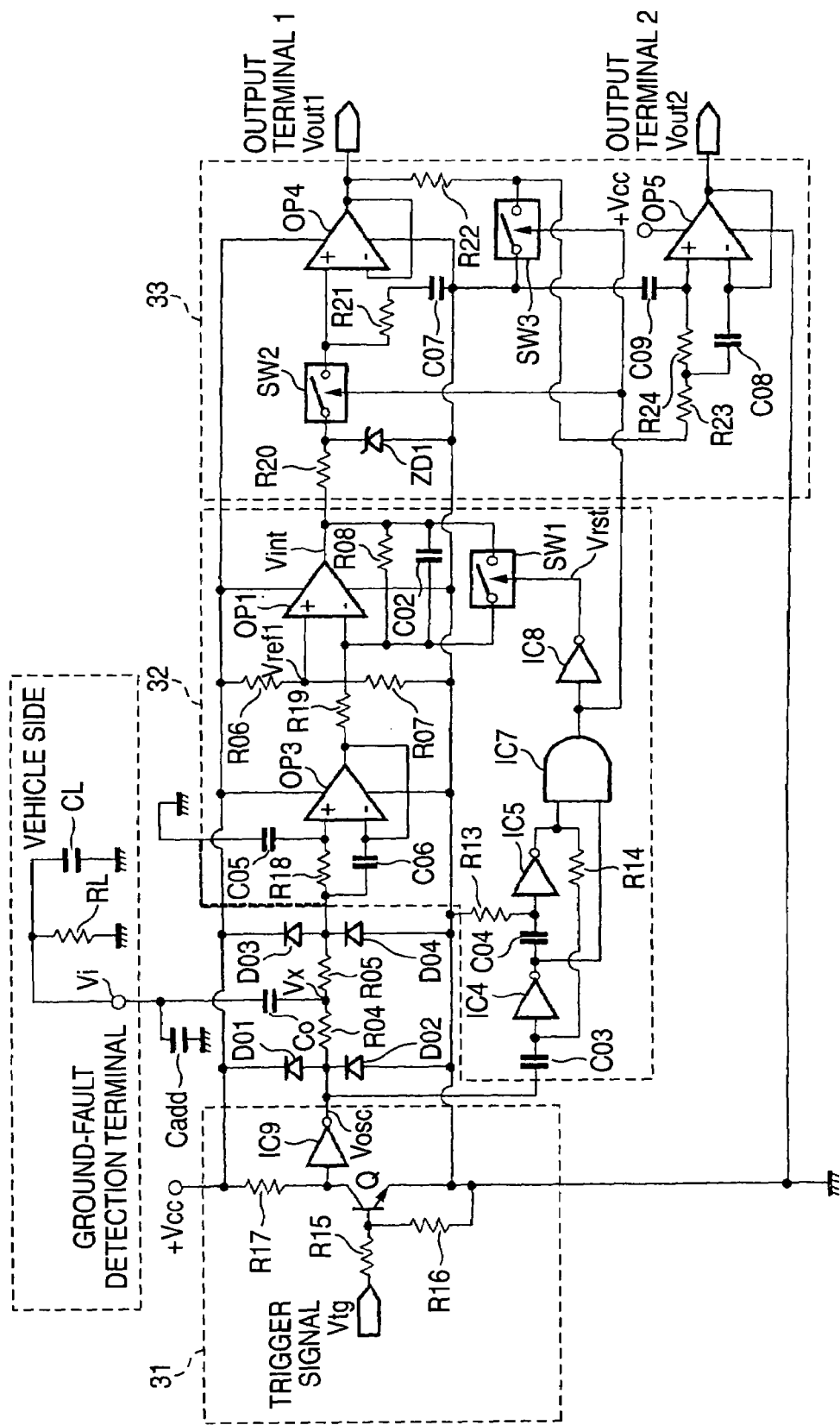
FIG. 4 is a circuit diagram showing the ground-fault detecting device according to a second embodiment of the invention.

Next, FIG. 4 is a circuit diagram showing a ground-fault detecting device according to a second embodiment of the invention. The circuit of FIG. 4 is approximately the same as the circuit of FIG. 2 except for the following points. The pulse signal generating unit 31 is different in configuration from that shown in FIG. 2 in that the former is composed of a trigger signal input terminal Vtg to which a rectangular pulse signal is input from an external rectangular wave signal source (not shown), a transistor Q1, resistors R15, R16, and R17, and an inverter IC9 and produces, at the output terminal of the inverter IC9, an output that is similar to a rectangular pulse signal produced by the rectangular wave oscillation circuit of the circuit of FIG. 2. In the integrating unit 32, a low-pass filter which includes an operational amplifier OP3, a resistor R18, and capacitors C05 and C06 is added upstream of the integration circuit. The low-pass filter passes only the rectangular pulse signal that is supplied from the pulse signal generating unit 31 and prevents input of noise that is higher in frequency than the rectangular pulse signal to the integration circuit.

In the integration reset signal generation circuit of the integrating unit 32, the inverter IC3 shown in FIG. 2 is omitted and the NAND gate IC6 shown in FIG. 2 is replaced by an AND gate IC7 and an inverter IC8. An integration reset signal that is produced at the output terminal of the inverter IC8 is supplied to the analog switch SW1 of the integration circuit as a control signal.

The ground-fault judging unit 33 is a sample-and-hold circuit that is composed of operational amplifiers OP4 and OP5, resistors R20, R21, R22, R23, and R24, capacitors C07, C08, and C09, a Zener diode ZD1, and analog switches SW2 and SW3. An output terminal Vout1 is connected to the output side of the operational amplifier OP4 and an output terminal Vout2 is connected to the output side of the operational amplifier OP5. A signal that is obtained at the output terminal of the AND gate 7 of the integration reset signal generation circuit and is opposite in polarity to the integration reset signal is supplied to the analog switches SW2 and SW3 as a control signal.

In the above configuration, since the inverter IC3 shown in FIG. 2 is omitted in the integration reset signal generation circuit of FIG. 4, the integrating unit 32 performs integration in a low-level interval of a pulse signal Vosc that appears at the connecting point of the detection resistor R04 and the coupling capacitor Co.

Figure 5A:
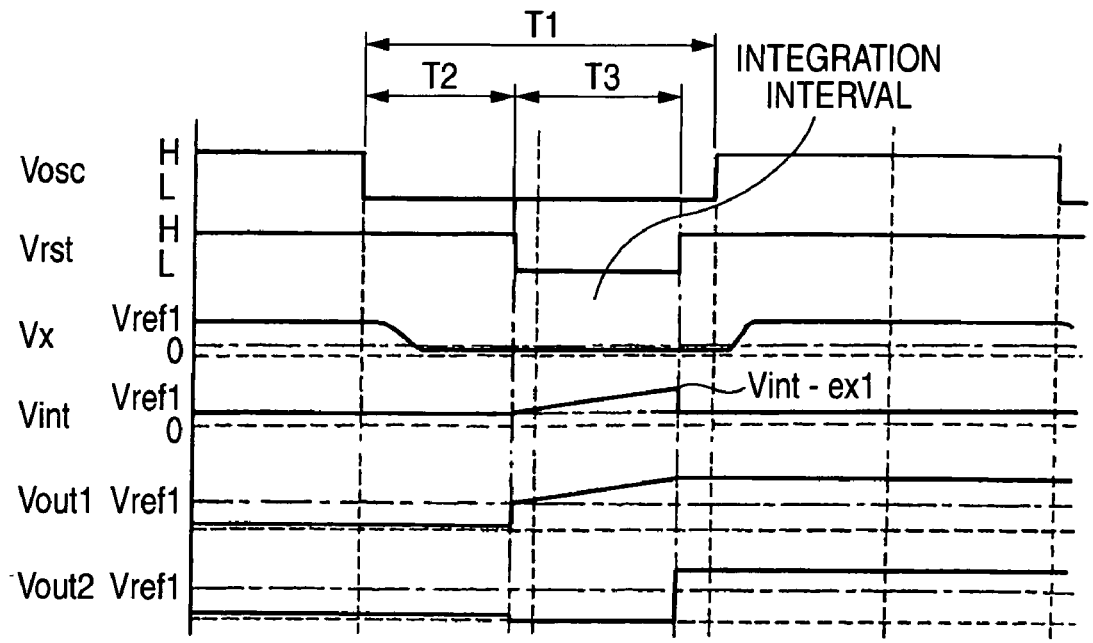
FIGS. 5A and 5B are timing charts of signals at individual points in the circuit diagram of FIG. 4 in a state that is free of a ground fault and at the occurrence of a ground fault, respectively.
Figure 5B:
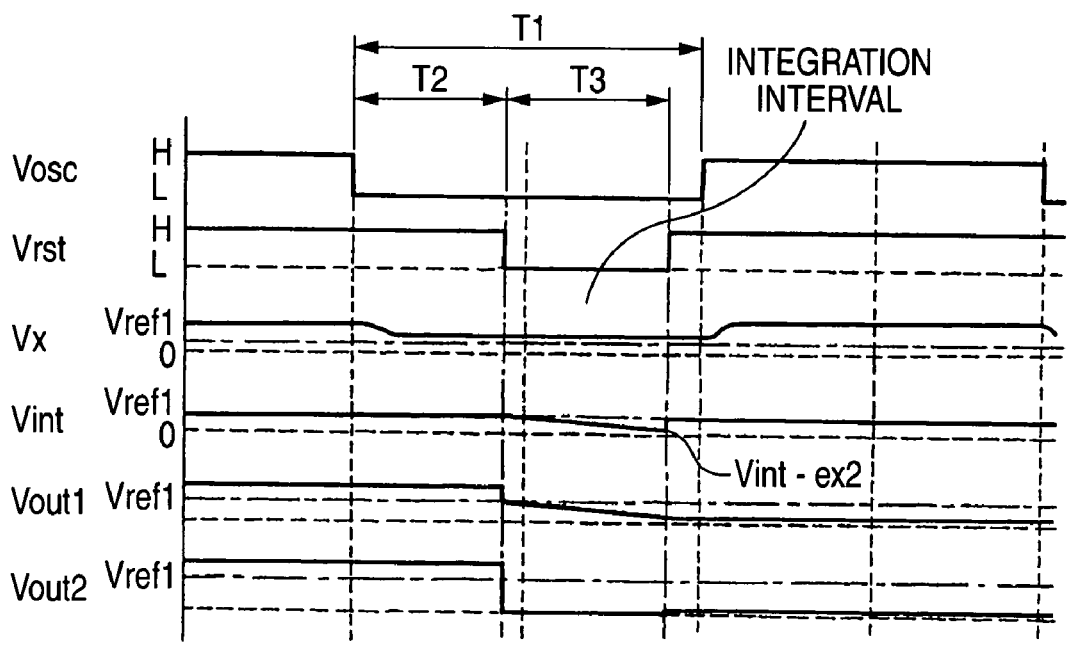

FIGS. 5A and 5B are timing charts of signals at individual points in a state that is free of a ground fault and at the occurrence of a ground fault, respectively.

In the ground-fault detecting device 1 of FIG. 4, the sample-and-hold circuit sample-and-holds an integration value as an integration output of the integration circuit of the integrating unit 32 (i.e., a voltage at the end of the integration interval T3). That is, the analog switches SW2 and SW3 are controlled so as to be kept on during the integration interval T3 and to be kept off during the intervals other than the integration interval T3, whereby, for example, an analog voltage value of an integration value Vint_ex1 of the integration circuit at the end of the integration interval T3 (in the case of no ground fault; see FIG. 5A) or an integration value Vint_ex2 of the integration circuit at the end of the integration interval T3 (in the case of occurrence of a ground fault; see FIG. 5B) is obtained at the output terminal Vout1. This analog voltage value corresponds to the insulation resistance RL. A waveform in which the output voltage is almost kept at 0 V (GND) during the integration interval T3 can be obtained at the output terminal Vout2.

As described above, the ground-fault detecting device having the circuit of FIG. 5 can produce a pulse waveform having an analog voltage value corresponding to the insulation resistance RL.

The ground-fault detecting device according to the invention can be applied to an insulation resistance measuring device. Such an application example will be described next.

Figure 6:
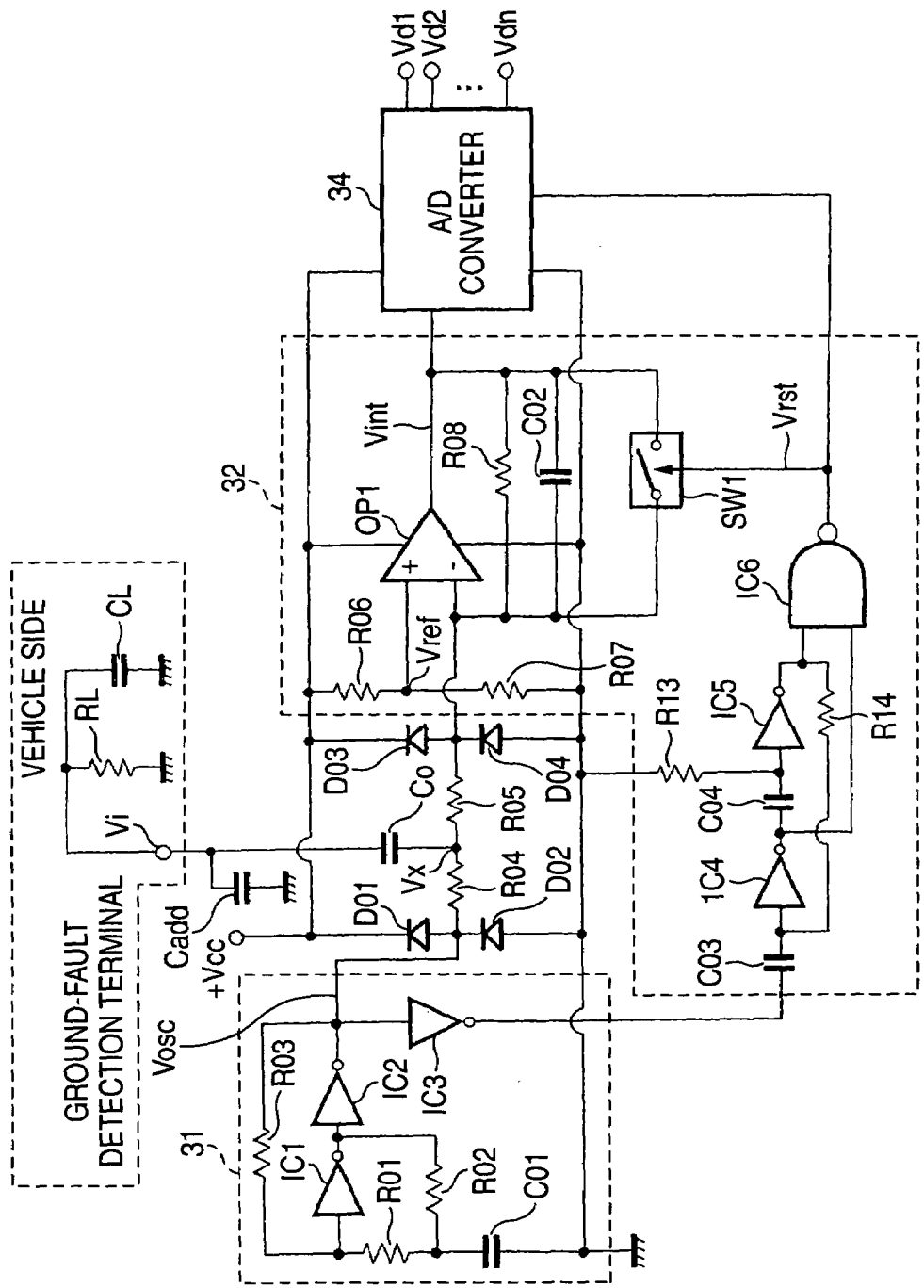
FIG. 6 is a circuit diagram showing a resistance measuring device to which the ground-fault detecting device according to the invention is applied.

FIG. 6 is a circuit diagram showing an exemplary configuration of an insulation resistance measuring device to which the ground-fault detecting device according to the invention is applied. In FIG. 6, the circuits of the ground-fault detecting device 1 of FIG. 2 except the ground-fault judging unit 33 are employed and an A/D converter 34 is connected to the output of the integration circuit of the integrating unit 32. The integration reset signal Vrst is supplied from the integration reset signal generation circuit to the A/D converter 34 as a input read timing signal therefor.

In the above configuration, the A/D converter 34 reads and A/D-converts an integration value as an integration output of the integration circuit of the integrating unit 32 (i.e., a voltage at the end of the integration interval T3) with timing that is determined by the integration reset signal Vrst that is supplied from the integration reset signal generation circuit. When the insulation resistance RL varies, the integration value as the integration output of the integration circuit also varies accordingly. Therefore, a digital value corresponding to the integration value is obtained at a corresponding one of a plurality of output-side insulation resistance measurement terminals Vd1, Vd2, . . . , Vdn of the A/D converter 34 as a digital value representing the insulation resistance RL.

As described above, the insulation resistance measuring device using the ground-fault detecting device can easily produce a digital value corresponding to an insulation resistance.

Although the embodiments of the invention have been described above, the invention is not limited to those embodiments and various modifications and applications are possible.

For example, in the above embodiments, the integration interval T3 is at least part of the high-level interval of a pulse signal. Instead, the integration interval T3 may be at least part of the low-level interval of a pulse signal. The length of the integration interval T3 may be varied as appropriate in the high-level interval or the low-level interval of a pulse signal.

In the above embodiments, the rectangular wave oscillation circuit is used as the pulse signal generating unit 31. However, the invention is not limited to such a case; a circuit which generates a pulse signal having a waveform other than a rectangular wave may be employed.

The insulation resistance measuring device of FIG. 6 employs the circuits of the ground-fault detecting device 1 of FIG. 2 except the ground-fault judging unit 33. However, the invention is not limited to such a case. A configuration is possible in which all the circuits of the ground-fault detecting device 1 of FIG. 2 are employed and the A/D converter 34 is connected to the output of the integration circuit of the integrating unit 32. The integration reset signal Vrst is supplied from the integration reset signal generation circuit to the A/D converter 34 as a input read timing signal therefor. In this case, not only can a ground-fault detection output be obtained at the output of the ground-fault judgment circuit 33, but also a digital value representing an insulation resistance at the occurrence of a ground fault can be obtained at the same time.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A ground-fault detecting device, comprising:
    a power source, electrically insulated from a vehicle body;
    a pulse signal generator, generating a pulse signal having a high level and a low level which appear repeatedly in a prescribed cycle;
    a detection resistor, connected to the pulse signal generator and the power source;
    a coupling capacitor, connected to the detecting resistor in series;
    an integrator, integrating a difference between a first reference voltage and a detection voltage of the pulse signal at a connecting point of the detection resistor and the coupling capacitor over an integration interval; and
    a ground-fault determinant, judging whether a ground fault has occurred on the basis of an output of the integrator,
    wherein the integration interval has at least part of a high-level interval or a low-level interval of the pulse signal.

2. The ground-fault detecting device as set forth in claim 1, wherein the integrator includes:
    an integration circuit, integrating the difference between the detection voltage and the first reference voltage; and
    an integration reset signal generation circuit, generating a reset signal for rendering the integration circuit in a reset state over intervals other than the integration interval on the basis of the pulse signal supplied from the pulse signal generator.

3. The ground-fault detecting device as set forth in claim 1, wherein the ground-fault determinant is a hysteresis comparator which compares the output of the integrator with a second reference voltage for obtaining a ground-fault detection output.

4. The ground-fault detecting device as set forth in claim 1, wherein the ground-fault determinant is a sample-and-hold circuit which sample-and-holds the output of the integrator as an integration value for obtaining a ground-fault detection output.

5. The ground-fault detecting device as set forth in claim 1, further comprising a compensation capacitor, having a capacitance corresponding to a vehicle-side capacitance, and provided between the vehicle body and the coupling capacitor.

6. The ground-fault detecting device as set forth in claim 1, wherein the integrator comprises an operational amplifier, a switch, and a reset signal generation circuit.

7. An insulation resistance measuring device, comprising:
    a power source;
    an insulation resistance, electrically insulating the power source from a vehicle body;
    a pulse signal generator, generating a pulse signal having a high level and a low level which appear repeatedly in a prescribed cycle;
    a detection resistor, connected to the pulse signal generator and the power source;
    a coupling capacitor, connected to the detecting resistor in series;
    an integrator, integrating a difference between a first reference voltage and a detection voltage of the pulse signal at a connecting point of the detection resistor and the coupling capacitor over an integration interval; and
    an A/D converter, A/D converting an output of the integrator as an integration value so as to generate a digital value corresponding to a resistance value of the insulation resistance,
    wherein the integration interval has at least part of a high-level interval or a low-level interval of the pulse signal.

8. The insulation resistance measuring device as set forth in claim 7, further comprising a ground-fault determinant, judging whether a ground fault has occurred on the basis of an output of the integrator.

9. The insulation resistance measuring device as set forth in claim 7, further comprising a compensation capacitor, having a capacitance corresponding to a vehicle-side capacitance, and provided between the vehicle body and the coupling capacitor.

10. The insulation resistance measuring device as set forth in claim 7, wherein the integrator comprises an operational amplifier, a switch, and a reset signal generation circuit.

* * * * *